(12) United States Patent
Tate, Jr. et al.

(10) Patent No.: US 6,441,586 B1
(45) Date of Patent: Aug. 27, 2002

(54) STATE OF CHARGE PREDICTION METHOD AND APPARATUS FOR A BATTERY

(75) Inventors: Edward Dean Tate, Jr., Grand Blanc; Mark William Verbrugge, Troy; Shawn D. Sarbacker, Royal Oak, all of MI (US)

(73) Assignee: General Motors Corporation, Detroit, MI (US)

( * ) Notice: Subject to any disclaimer, the term of this patent is extended or adjusted under 35 U.S.C. 154(b) by 63 days.

(21) Appl. No.: 09/814,528

(22) Filed: Mar. 23, 2001

(51) Int. Cl.[7] .............................................. H01M 10/49
(52) U.S. Cl. ...................................................... 320/132
(58) Field of Search ................................. 320/132, 149, 320/104; 324/427, 433; 340/870.05, 439

(56) References Cited

U.S. PATENT DOCUMENTS 5,570,087 A * 10/1996 Lemelson
5,714,866 A *  2/1998 S et al.
6,329,793 B1 * 12/2001 Bertness et al.

* cited by examiner

*Primary Examiner*—Edward H. Tso
(74) *Attorney, Agent, or Firm*—Christopher DeVries

(57) ABSTRACT

A method of determining the state of a battery including the steps of generating a state vector that describes the state of the battery, predicting a response for the state vector, measuring a response of the battery, and correcting the state vector based on the differences between the predicted response and a measured response to determine the state of the battery.

21 Claims, 4 Drawing Sheets

STATE OF CHARGE PREDICTION METHOD AND APPARATUS FOR A BATTERY

TECHNICAL FIELD

The present invention relates to a method and apparatus for determining the state of a battery. More specifically, the present invention relates to a prediction and correction method for determining the state of charge of a battery.

BACKGROUND OF THE INVENTION

In today's automotive market, there exist a variety of propulsion or drive technologies used to power vehicles. The technologies include internal combustion engines (ICEs), electric drive systems utilizing batteries and/or fuel cells as an energy source, and hybrid systems utilizing a combination of internal combustion engines and electric drive systems. The propulsion systems each have specific technological, financial, and performance advantages and disadvantages, depending on the state of energy prices, energy infrastructure developments, environmental laws, and government incentives.

The increasing demand to improve fuel economy and reduce emissions in present vehicles has led to the development of advanced hybrid vehicles. Hybrid vehicles are classified as vehicles having at least two separate power sources, typically an internal combustion engine and an electric traction motor. Hybrid vehicles, as compared to standard vehicles driven by an ICE, have improved fuel economy and reduced emissions. During varying driving conditions, hybrid vehicles will alternate between separate power sources, depending on the most efficient manner of operation of each power source. For example, a hybrid vehicle equipped with an ICE and an electric motor will shut down the ICE during a stopped or idle condition, allowing the electric motor to propel the vehicle and eventually restart the ICE, improving fuel economy for the hybrid vehicle.

Hybrid vehicles are broadly classified into series or parallel drivetrains, depending upon the configuration of the drivetrains. In a series drivetrain utilizing an ICE and an electric traction motor, only the electric motor drives the wheels of a vehicle. The ICE converts a fuel source to mechanical energy to turn a generator which converts the mechanical energy to electrical energy to drive the electric motor. In a parallel hybrid drivetrain system, two power sources such as an ICE and an electric traction motor operate in parallel to propel a vehicle. Generally, a hybrid vehicle having a parallel drivetrain combines the power and range advantages of a conventional ICE with the efficiency and electrical regeneration capability of an electric motor to increase fuel economy and lower emissions, as compared with a traditional ICE vehicle.

Battery packs having secondary/rechargeable batteries are an important component of hybrid or electrical vehicle systems, as they enable an electric motor/generator (MoGen) to store braking energy in the battery pack during regeneration and charging by the ICE. The MoGen utilizes the stored energy in the battery pack to propel or drive the vehicle when the ICE is not operating. During operation, the ICE will be turned on and off intermittently, according to driving conditions, causing the battery pack to be constantly charged and discharged by the MoGen. The state of charge (SOC, defined as the percentage of the full capacity of a battery that is still available for further discharge) is used to regulate the charging and discharging of the battery.

Rechargeable batteries are also an important component in other applications where a battery pack is continually cycled, such as in solar-powered battery packs for satellites, portable communication apparatus and non-interruptable power supplies.

The preferred embodiment of the present invention utilizes a nickel/metal hydride (NiMH) battery in the battery pack. A NiMH battery stores hydrogen in a metal alloy. When a NiMH cell is charged, hydrogen generated by the cell electrolyte is stored in the metal alloy (M) in the negative electrode. Meanwhile, at the positive electrode, which typically consists of nickel hydroxide loaded in a nickel foam substrate, a hydrogen ion is ejected and the nickel is oxidized to a higher valency. On discharge, the reactions reverse. The reaction at the negative electrode is more clearly shown by the following reaction diagram:

The discharging direction is represented by $\rightarrow$; the charging direction is represented by $\leftarrow$.

On discharge, OH- ions are consumed at the negative hydride electrode and generated at the nickel oxide positive electrode. The converse is true for the water molecules.

A difficulty with NiMH batteries is predicting their SOC because of the charging and discharging characteristics of NiMH battery technology.

Referring to FIG. 1, typical charge increasing 10 and charging decreasing 12 curves are illustrated for a NiMH battery. Referencing points A and B and points C and D, it can be shown that the voltages are the same while the SOCs are substantially different. Thus, it is very difficult to use an open circuit voltage to accurately predict the SOC of the NiMH battery, as the battery operating operation (charge increasing, charge sustaining or charge decreasing) must be known. Furthermore, coulombic integration methods to determine the SOC of a battery suffer from accumulated errors. When used with a hybrid vehicle, the intermittent charging and discharging of the battery pack amplifies the problems associated with predicting the SOC of a NiMH battery pack. To successfully operate a hybrid powertrain of a vehicle incorporating a battery pack, an accurate and repeatable estimate of battery SOC is needed.

A technique used by the present invention to describe the SOC and operating characteristics of a battery is state estimation. When a system can be described by either a differential or difference equation, there are state variables associated with that system. These systems are typically referred to as dynamical (or dynamic) systems. A very simple example of such a system comprises:

$$\frac{dx}{dt} = \dot{x} = f(x)$$

or $$x_{k+1} = f(x_k)$$

The notation $\dot{x}$ is used to denote differentiation with respect to time. This is a system without an input that has a state x that evolves over time according to the function $f$. The values at a given time are completely determined by the initial value $x_0$. A more complex system includes inputs and observations (or measurements). An example of such a system is $$x_{k+1} = f_s(x_k, u_k)$$

$$y_k = f_m(x_k, u_k)$$

In this case, u is an input and y is an observable output of the system. $f_s$ maps the current state, $x_k$, and input, u, to the next state $X_{k+1}$. $f_m$ maps the current state and input to the measurement y. When these equations are used to describe physical systems, noise is added to the description of the system. An example of this is $$x_{k+1} = f_s(x_k, u_k) + n_p$$

$$y_k = f_m(x_k, u_k) + n_m$$

In this example, $n_p$ is the noise associated with the evolution of the state. $n_m$ describes noise associated with measurement.

State estimation refers to the set of techniques used to determine the state x given the measurements y for dynamical systems illustrated above. Two very common approaches to state estimation are (a) inversion methods such as $\hat{x}_k = f_m^{-1}(y,u)$ and (b) ad hoc/expert system methods which estimate state based on special case tests or conditions.

For special cases of systems, there are optimal methods for performing state estimation. For linear systems in the presence of white gaussian noise, a Kalman Filter (KF) is the optimal state estimator. The KF estimates the state of the system with the minimum mean squared error between the estimate and the true value. The KF estimates the state using all information available in the model, the noise characterization and all previous observations.

For nonlinear systems, there are several methods available to perform state estimation. The most common of these is the Extended Kalman Filter (EKF) and Hybrid Kalman Filter (HKF). Both linearize the system to update the state estimate. Both are near optimal methods for estimating a systems state.

SUMMARY OF THE INVENTION

The present invention includes a method and apparatus to determine the state of charge (SOC) and operating characteristics of a battery pack utilizing NiMH batteries or any other rechargeable battery technology known in the art including, but not limited to, lead acid and lithium polymer batteries. The method of the present invention includes an SOC algorithm that combines the concepts of state estimation with the concepts of system identification in a prediction-correction model. The SOC in a battery and the voltage hysteresis of the battery are estimated as states of the battery. The resistance and impulse response of the battery are estimated using system identification techniques. The state and the system identification are used in combination to establish an optimal estimation of the SOC and other characteristics of a battery.

The SOC algorithm of the present invention relies on a simplified model of the battery behavior that includes an amp-hour integrator, a first order differential equation describing voltage hysteresis, an adaptive description of battery impedance, a function which relates battery charge hysteresis, impedance and current to terminal voltage, and a description of the measurement errors and modeling errors. The model of the battery behavior and description of the measurement and modeling errors are combined into an Extended Kalman Filter (EKF). In operation, the EKF uses the model of the battery to predict the voltage on the terminals due to the current on the terminals. The difference between the predicted voltage and the measured voltage is then used to correct the state variables. The correction to the state variables is a near optimal method for minimizing the sum of squared errors between the estimated values and the actual values.

The present invention, in the preferred embodiment, further includes a vehicle having a parallel hybrid drive system incorporating an energy management controller and hybrid system controller executing the methods of the present invention, an internal combustion engine (ICE), and a motor-generator (MoGen) that charges and discharges the battery pack. The MoGen not only provides for propulsion of the vehicle during certain vehicle operating conditions but also replaces an alternator to charge the battery pack in the vehicle and replaces a conventional starter motor to start the ICE. The hybrid drive system of the present invention will utilize the ICE and MoGen to propel or motor the vehicle during the vehicle conditions which are most efficient for the ICE or MoGen operation. For example, during deceleration or a stopped condition, fuel flow to the ICE will be cut off, as these conditions are some of the least efficient conditions to run the ICE. The MoGen system becomes the active propulsion or motoring system during this fuel cut-off feature and powers the vehicle without noticeably disturbing the operation of the vehicle or sacrificing driveability. The MoGen will propel the vehicle and smoothly transition the vehicle from the idle or stopped state and start the ICE for ICE driving conditions. The transfer of power between the MoGen and ICE or vice versa is transparent to the operator or driver, as the vehicle will perform as if there is only one drive system propelling the vehicle.

During normal operation of the vehicle when the ICE is running, the MoGen will act as an electrical generator to supply electrical power to the vehicle's electrical infrastructure (fans, radios, instrumentation, control, etc.) as well as recharging the battery pack. The battery pack and a power supply, such as a DC—DC converter, will supply power to the vehicle electrical infrastructure and power the MoGen when it is operating as the motoring device for the vehicle. In the motoring mode, the MoGen is an electrical load drawing current from the battery pack.

DESCRIPTION OF THE PREFERRED EMBODIMENT

Figure 1:
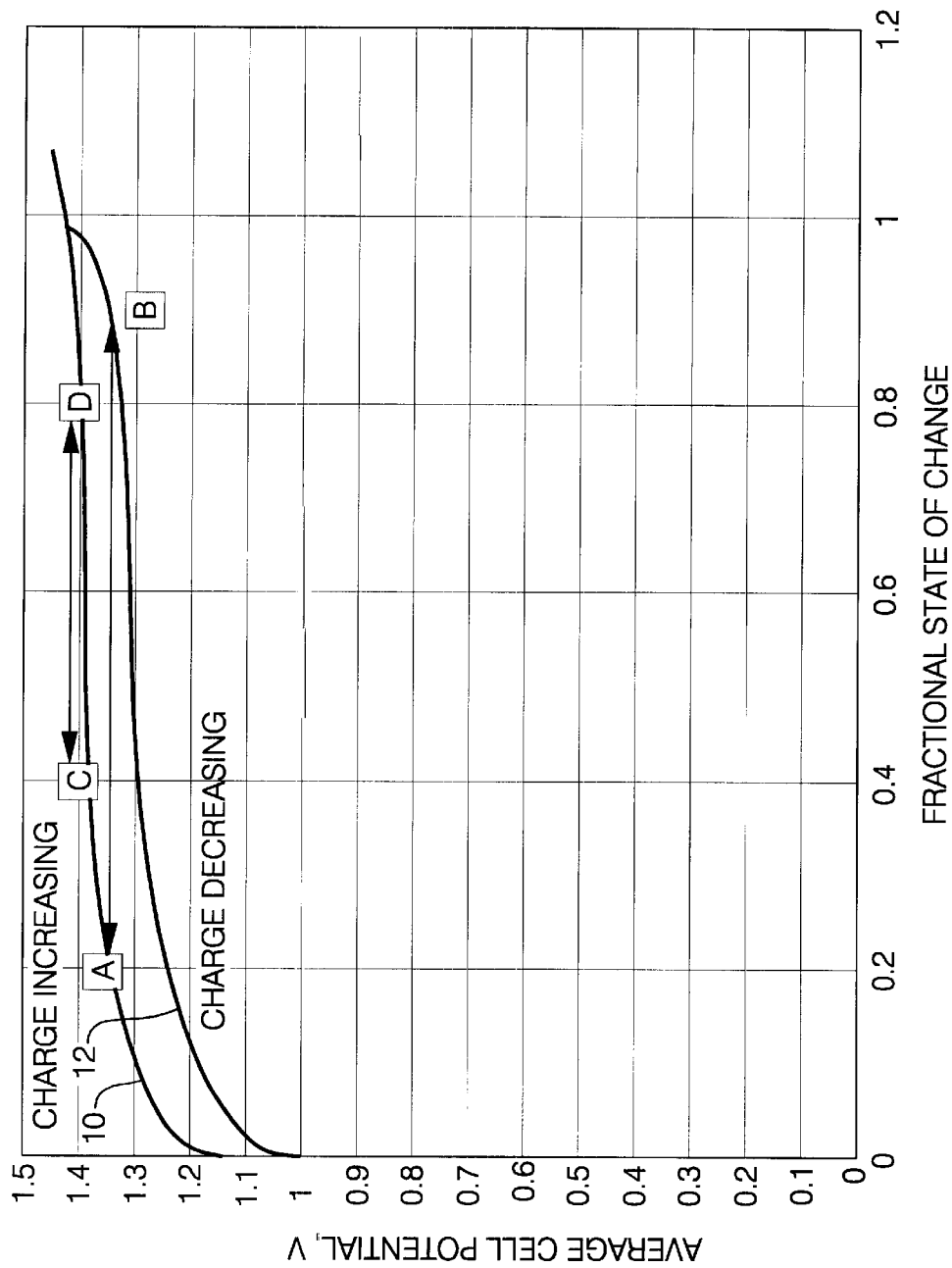
FIG. 1 is a diagrammatic drawing of a NiMH battery potential for rates of charge (upper curve) and discharge (lower curve)
Figure 2:
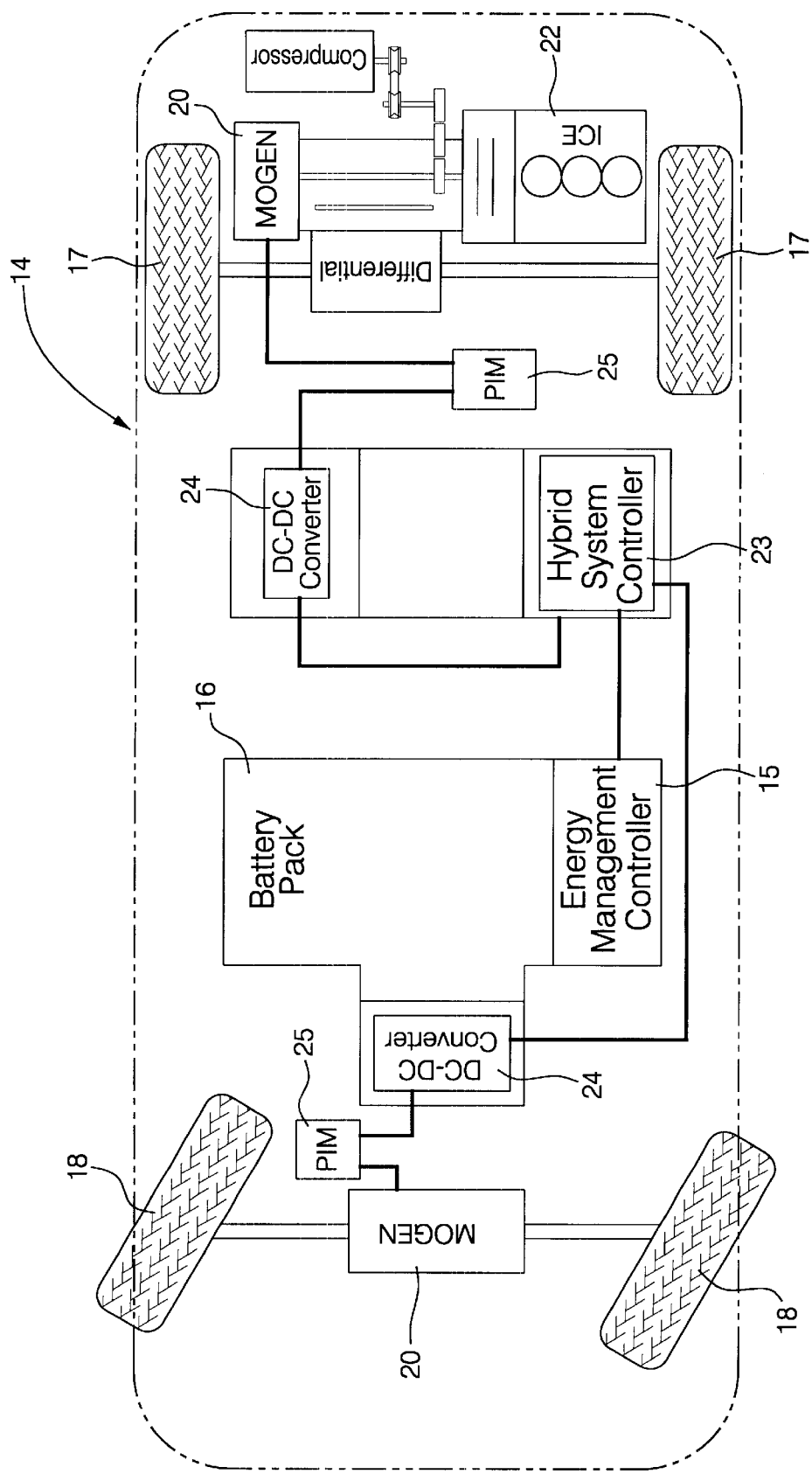
FIG. 2 is a diagrammatic drawing of the hybrid vehicle of the present invention.

FIG. 2 is a diagrammatic drawing of a hybrid vehicle 14 of the present invention. The hybrid vehicle 14 includes a battery pack 16 having a single battery module or individual battery modules. In the preferred embodiment, the battery pack 16 comprises a plurality of NiMH batteries connected in series to produce a 36 Volt nominal bus. In alternate embodiments of the present invention, the battery pack 16 may comprise any known battery technology, including but not limited to lead acid and lithium polymer.

A motor generator (MoGen) 20 is dynamically coupled to an internal combustion engine (ICE) 22 and functions as either a motor to propel the vehicle 14 or a generator to charge the battery pack 16, depending on the operating state of the vehicle 14 (i.e., braking, stopped, or operating at a constant speed on a highway). The MoGen 20 is preferably an AC induction machine but may comprise any known electrical motor/generator technology, including, but not limited to, DC machines, synchronous machines, and switched reluctance machines. The MoGen 20 in the preferred embodiment is located on the rear of the vehicle to drive the rear wheels 17. A similar MoGen 20 is located on the front of the vehicle to drive the front wheels 18.

The MoGens 20 are controlled by an electrical control system comprising a hybrid system controller 23, DC—DC converters 24 and power inverter modules 25. In alternate embodiments of the present invention, the controller 23, DC—DC converters 24, and power inverter modules 25 may be configured as a unitary system. The hybrid system controller 23 may comprise any type of control module or vehicle controller known in the art, and is equipped with nonvolatile memory (NVM), random access memory (RAM), discrete and analog input/output (I/O), a central processing unit, communications interfaces for conventional and wireless (Bluetooth®) networking within an automotive communications network, etc.

The MoGens 20 in generator mode generate electrical energy that is transferred to the battery pack 16 and the DC—DC converters 24 by the controller 23 and inverter modules 25. The controller 23 and inverter modules 25 determine the direction of current flow for the MoGens 20, according to the vehicle 14 operating state. The DC—DC converters 24 provide and regulate the DC bus that is pulse-width-modulated by the inverter modules 25 to supply time varying current to the MoGens 20. In a regeneration state (such as during braking) or charging condition, current will flow from the MoGens 20, via the inverter modules 25, to charge the battery pack 16 and provide current to the DC—DC converters 24. In a state where the MoGens 20 are needed to provide propulsion, current will flow from the battery pack 16 to the MoGens 20, via the DC—DC converters 24 and inverter modules 25, to power the MoGens 20.

In the preferred embodiment of the present invention, the SOC of the battery pack 16 is dynamically tracked to determine when to charge the battery pack 16. The hybrid controller 23 of the present invention will control a battery pack's SOC near 50% to 80% so that the charge acceptance and efficiency during regenerative braking can be realized, although controlling the battery pack 16 to any SOC percentage is within the scope of the present invention.

To determine and control the SOC of the battery pack 16, the following methods will be employed. To aid in the understanding of the following methods and algorithms, variables and functions will be defined as follows:

Definition of Variables Used in the Preferred Method:

| | |
|---|---|
| $\alpha$ | a vector, which when cross multiplied by the RTDL vector results in an estimate of the impulse response voltage |
| $\left(\dfrac{E}{R}\right)$ | constant in the self discharge equation, nominal value of 6789 |
| F | temporary matrix used to hold linearized value of propagation equations |
| $F_N$ | constant in the Nernst equation, nominal value of 96487 |
| H | temporary matrix used to hold linearized values of measurement equation |
| $I_{Parasitic}$ | the parasitic current drawn from the battery while not monitored, units in amps |
| $I_{Identity}$ | Identity matrix |
| I | value of cell terminal current as sample k, units of amps |
| K0 | constant in the self discharge equation, nominal value 1.0683e7 in units of 1/hr |
| Kf | temporary matrix, holds the Kalman gain |
| KG | temporary matrix used |
| $P_0$ | initial value of the estimate covariance or quality of the estimate $$\begin{bmatrix} var(Q_0) & 0 & 0 \\ 0 & var(Q_{H_0}) & 0 \\ 0 & 0 & covar(a_0) \end{bmatrix}$$ nominal values are: $$\begin{bmatrix} 3.0 & 0 & 0 \\ 0 & 1.0 & 0 \\ 0 & 0 & diag([0.0001]) \end{bmatrix}$$ |
| $Q_{max}$ | capacity of the battery, nominal value of 12.6 amp-hrs |
| $Q_{H\,max\,0}$ | amount of charge in hysterysis, nominal value of 1.8 amp-hrs |
| Q | estimate of the number of amp-hours in the pack |
| $Q_0$ | value to use to initialize the estimate on a new battery, nominal value of $0.5 \cdot Q_{Max}$ |
| $Q_H$ | estimate of the charge associated with the hysterysis voltage, units of amp-hrs |
| $Q_{H_0}$ | value used to initialize the hysterysis voltage estimation, nominal value of 0 amp-hrs |
| R | variance of voltage measurement, nominal value of 0.0025 |
| Re | temporary matrix |
| Rg | constant in Nernst Equations, nominal value 8.314 |
| RTDL | a history vector which contains transformation of current information. The elements of the vector are current values which are subjected to one or more of the following operations: delays in time, resampling, frequency filtering, linear scaling and nonlinear scaling, units of amps. |
| T | value of cell skin temperature at sample k, units of degrees Kelvin |
| Ts | sample time in seconds, nominal value of 1.00 |
| $U^\Theta$ | pivot voltage in Nernst Equations, nominal value of 1.345 volts |
| V | value of cell terminal voltage at sample k, units of volts |
| $x^-$ | vector containing the states and parameter estimates of the battery prior to correction from the measurements $[Q\ Q_H\ \alpha^T]^T$ |
| $x^+$ | vector containing the states and parameter estimations of the battery after the correction from measurements $[Q\ Q_H\ \alpha^T]^T$ |
| $\beta$ | rate of hysteresis charge change, nominal value of 1.6 hr |
| $\gamma$ | ratio of hysteresis charge to cell voltage, nominal value of 0.02222 V/amp-hr |
| $\delta$ | reciprocal of amount of charge required to saturate hysteresis, nominal value $\dfrac{1}{0.1 \cdot Q_{max}}$ |

Definition of Functions Used in the Preferred Method:

$\alpha_{Var}(I)$—process noise variance associated with the impulse response parameters as a function of current.

| abs(I) | Variance |
|---|---|
| 0 | 0.0000055 |
| 1 | 0.0000060 |
| 5 | 0.0000100 |
| 25 | 0.0000250 |
| 100 | 0.0001000 | next_x=$f(x,u)$—a discrete time nonlinear model of battery dynamics where $[Q\ Q_H\ \alpha^T]=x^T$ and $[I\ T]=u^T$, next_Q=Q+((I·η(Q,T)−I$_{SD}$(Q,T))/3600)·Ts if(I−I$_{SD}$>0)

$$next\_Q_H = Q_H + \beta \cdot \left(\frac{(I + I_{SD}(Q, T))}{3600}\right) \cdot Ts \cdot \frac{Q_{Hmaxinc}(Q) - Q_H}{Q_{Hmaxinc}(Q)}$$

else $$next\_Q_H = Q_H + \beta \cdot \left(\frac{(I + I_{SD}(Q, T))}{3600}\right) \cdot Ts \cdot \frac{Q_{Hmaxdec}(Q) + Q_H}{Q_{Hmaxdec}(Q)}$$

next_α=α next_x=[next_Q next_Q$_H$ next_α$^T$]$^T$ dfdx(x,u)—the Jacobian matrix of $f$(x,u) with respect to x The vector [I T]=u$^T$ contains the current and temperature.

The vector [Q Q$_H$ α$^T$]=x$^T$ contains the state estimate.

If I>0 this function returns $$\begin{bmatrix} \left(1 + d\eta dQ(I, Q, T) \cdot Ts \cdot \frac{I}{3600} - Ts \cdot \frac{I_{SD}(Q,T)}{Q \cdot 3600}\right) & 0 & 0 \\ \left(\beta \cdot Ts \cdot \left(\frac{-I_{SD}(Q,T)}{Q \cdot 3600}\right) \cdot \frac{Q_{Hmax}(Q) - Q_H}{Q_{Hmax}(Q)}\right) & \left(1 - \beta \cdot \frac{I - I_{SD}(Q,T)}{3600} \cdot Ts\right) & 0 \\ 0 & 0 & diag(1) \end{bmatrix}$$

otherwise, it returns $$\begin{bmatrix} \left(1 + d\eta dQ(I, Q, T) \cdot Ts \cdot \frac{I}{3600} - Ts \cdot \frac{I_{SD}(Q,T)}{Q \cdot 3600}\right) & 0 & 0 \\ \left(\beta \cdot Ts \cdot \left(\frac{-I_{SD}(Q,T)}{Q \cdot 3600}\right) \cdot \frac{Q_{Hmax}(Q) + Q_H}{Q_{Hmax}(Q)}\right) & \left(1 + \beta \cdot \frac{I - I_{SD}(Q,T)}{3600} \cdot Ts\right) & 0 \\ 0 & 0 & diag(1) \end{bmatrix}$$

y=h(x,u,RTDL)—a function which forms voltage estimate from states and currents

[Q Q$_H$ α$^T$]=x$^T$

[I T]=u$^T$

V=QtoV(Q)+γ·Q$_H$+RTDL·α$^T$ y=[V]

dhdx(x,u,RTDL)—a function which returns the Jacobian of h(·) with respect to x

[Q Q$_H$ α$^T$]=x$^T$

[I T]=u$^T$ $$\frac{dh}{dx} = \begin{bmatrix} \frac{d}{dQ} & \frac{dh}{dQ_H} & \frac{dh}{da^T} \end{bmatrix}$$

where Q is in amp-hrs and T is in Kelvin, $$f = \frac{F}{Rg \cdot T}$$

$$SOC = \frac{Q}{Q_{max}}$$

$$\frac{dV}{dQ_H} = -\left(\frac{1}{T}\right) \cdot \left(\frac{1}{f}\right) \cdot \log\left(\frac{SOC}{1.0001 - SOC} + 0.0001\right)$$

$$\frac{dV}{dQ_H} = \gamma$$

$$\frac{dV}{da^T} = RTDL^T$$

I$_{SD}$(Q,T)—Self Discharge current as a function of charge and temperature where T is in Kelvin, and Q is in amp-hrs $$I_{SD} = K0 \cdot e^{\left(-\left(\frac{E}{R}\right)\frac{1}{T}\right)} \cdot Q \text{ in amps}$$

Q$_{H\,max\,inc}$(Q)—maximum hysteresis charge under charge increasing conditions $$Q_{H\,max\,inc} = (1 - e^{-\delta(Qmax - Q)}) \cdot Q_{H\,max\,0}$$

with $$\delta = \frac{1}{0.1 \cdot Q_{max}}$$

Q$_{H\,max\,dec}$(Q)—maximum hysteresis charge under charge decreasing conditions $$Q_{H\,max\,dec} = (1 - e^{-\delta \cdot Q}) \cdot Q_{H\,max\,0}$$

with $$\delta = \frac{1}{0.1 \cdot Q_{max}}$$

Q$_{HVar}$(Q)—process noise variance associated with propagation of the hysteresis estimate. This variance is associated with battery charge. All values are linearly interpolated.

| Q/Q$_{max}$ | Variance |
|---|---|
| 0.0 | 0.00001 |
| 0.1 | 0.00010 |
| 0.2 | 0.00020 |
| 0.4 | 0.00030 |
| 0.5 | 0.00050 |
| 0.6 | 0.00030 |
| 0.8 | 0.00020 |
| 0.9 | 0.00010 |
| 1.0 | 0.00001 |

$Q_{HVar}(Q_H,I)$—process noise variance associated with propagation of the hysteresis estimate. This variance is associated with voltage hysteresis charge. All values are linearly interpolated.

If I>0

| $Q_H/Q_{H\ max\ inc}$ (Q) | Variance |
|---|---|
| −1.0 | 0.050 |
| −0.8 | 0.050 |
| −0.6 | 0.050 |
| −0.4 | 0.050 |
| −0.2 | 0.050 |
| 0.0 | 0.050 |
| 0.2 | 0.050 |
| 0.4 | 0.040 |
| 0.6 | 0.030 |
| 0.8 | 0.020 |
| 1.0 | 0.001 |

Else

| $Q_H/Q_{H\ max\ dec}$ (Q) | Variance |
|---|---|
| −1.0 | 0.001 |
| −0.8 | 0.020 |
| −0.6 | 0.030 |
| −0.4 | 0.040 |
| −0.2 | 0.050 |
| 0.0 | 0.050 |
| 0.2 | 0.050 |
| 0.4 | 0.050 |
| 0.6 | 0.050 |
| 0.8 | 0.050 |
| 1.0 | 0.050 |

QtoV(Q,T)—equation which converts charge and temperature to open circuit voltage using the Nernst equation. Where Q is in amp-hrs and T is in Kelvin, $$f = \frac{F_N}{Rg \cdot T}$$

$$SOC = \frac{Q}{Q_{max}}$$

$$V = U^\theta + \frac{1}{f} \cdot \log\left(\frac{SOC}{1.0001 - SOC} + 0.0001\right), \text{ volts per cell}$$

Note: The relationship used for QtoV(Q,T) can be more general and is not limited to the Nernst equation for NiMH batteries.

$Q_{Var}(Q)$—process noise variance associated with the prediction of Q as a function of Q. Nominal values, linearly interpolated:

| Q/Q$_{max}$ | Variance |
|---|---|
| 0.0 | 0.00002 |
| 0.2 | 0.00001 |
| 0.4 | 0.00001 |
| 0.5 | 0.00001 |
| 0.6 | 0.00001 |
| 0.8 | 0.00005 |
| 1.0 | 0.00010 |

$\phi(Q,Q_H,I)$—process noise variance as a function of charge, hysteresis charge and current.

$$\varphi = \begin{bmatrix} Q_{Var}(Q) & 0 & 0 \\ 0 & (Q_{HVar}(Q) + Q_{HVar}(Q_H, I)) & 0 \\ 0 & 0 & a_{Var}(I) \end{bmatrix}$$

$\eta(Q, T)$—charge efficiency of the battery as a function of charge and temperature. The nominal value for this function is 0.99.

$d\eta dQ(I,Q,T)$—change in charge efficiency as a function of Q. Since the nominal value of $\eta(Q,T)$ is constant, this nominal value is 0.

This invention provides a method to estimate the state, including but not limited to the SOC, temperature, and power of a battery that relies on two distinct steps: a prediction of the next battery response and a correction based on the differences (i.e., quality of the prediction) between the prediction and the measured response of the battery. The correction is based on a statistically optimal method.

The method of the present invention, in a first embodiment, produces a state vector which preferably comprises a state of charge estimate, Q, a hysteresis charge estimate, $Q_H$, and a q×1 vector of learned battery responses, α. The learned battery responses are used to predict the terminal voltage that occurs under load.

$$\text{state vector} = x = \begin{bmatrix} Q \\ Q_H \\ a_1 \\ \vdots \\ a_q \end{bmatrix}$$

This dynamic voltage is formed by multiplying the learned battery response by a vector of current measurements which have been modified and time shifted.

Initialization

The first step in the preferred method is initialization. When the method is initialized for the first time, an initial value is selected for each of the state variables. Based on the variances and covariances (which can be quantified as the quality of the estimate) of the initialization vector, a covariance matrix is initialized, $P_0$. A vector that contains the current history is also initialized to a set of values that represents the currents prior to initialization. This vector is referred to as resampled, tap delay line (RTDL).

Figure 3:
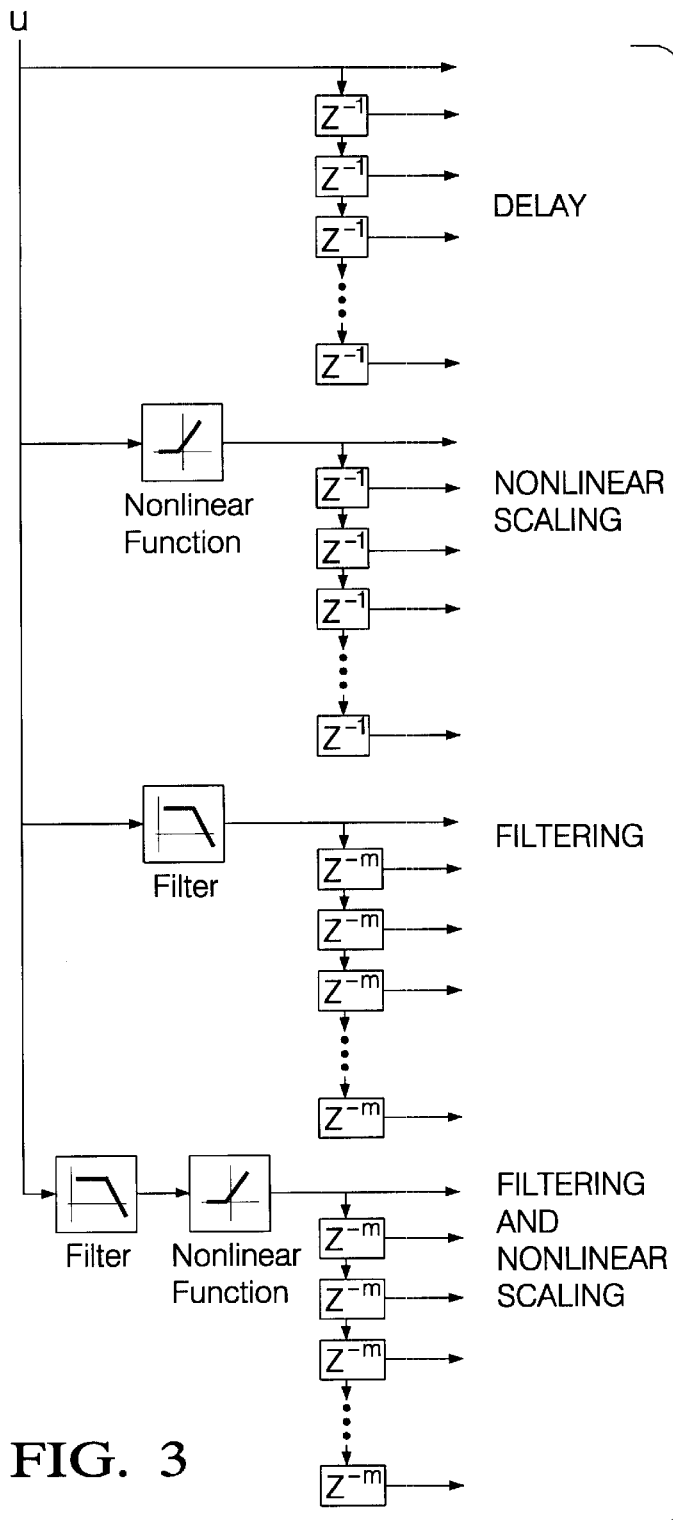
FIG. 3 is a process control flow diagram of the function generating the RTDL vector in the preferred method of the present invention.

Referring to the process flow diagram of FIG. 3, the RTDL vector can be expanded. The illustrated function forms the elements of the RTDL vector in combination of the following:

the input u undelayed by 1 or more sample intervals nonlinear functions of u nonlinear functions of u delayed by one or more sample intervals filtered values of u filtered values of u delayed by one or more samples combinations of filtered and nonlinear transforms on u and combinations of filtered and nonlinear transforms on u delayed by one or more samples First Initialization:

Let RTDL=[0].

Let $x^-=[Q_0 \; Q_{H_0} \; \alpha^T]^T$.

Let $P-=P_0$.

When the preferred method of the present invention is restarted after a long period without updates, the following procedure is used.

Recover $x^+$ from nonvolatile memory.

Recover T from nonvolatile memory and store in oldT.

Sample temperature and store in T.

Recover RTDL from nonvolatile memory.

Calculate the time in seconds since the last update of $x^+$ and store in t.

Let $x^-=x^+$.

Let $P^-=P^+$.

For i=1 to t repeatedly do the following:

Estimate the temperature at time i by

---

Recover $x^+$ from nonvolatile memory.
Recover T from nonvolatile memory and store in oldT.
Sample temperature and store in T.
Recover RTDL from nonvolatile memory.
Calculate the time in seconds since the last update of $x^+$ and store in t.
  Let $x^- = x^+$.
  Let $P^- = P^+$.
  For i = 1 to t repeatedly do the following:

Estimate the temperature at time i by $$\hat{T} = \text{old}T + i \cdot \frac{T - \text{old}T}{t}.$$

Let I = $I_{Parasitic}$
  Update RTDL using I.
  Let u = [I $\hat{T}$]$^T$.
  Propagate the value of $x^-$ by performing an iteration of the nonlinear model: $x^- = f(x^-, u)$.
  Linearize the model about the current operating point, let F = dfdx($x^-$,u).
  Get Q and $Q_H$ from the $x^-$ vector.
  Propagate the covariance estimate, Let $P^- = F \cdot P^- \cdot F^T + \phi(Q, Qh, I)$

---

Let I=$I_{Parasitic}$

Update RTDL using I.

Let u=[I $\hat{T}$]$^T$.

Propagate the value of $x^-$ by performing an iteration of the nonlinear model: $x^-=f(x^-,u)$.

Linearize the model about the current operating point, let F=dfdx($x^-$,u).

Get Q and $Q_H$ from the $x^-$ vector.

Figure 4:
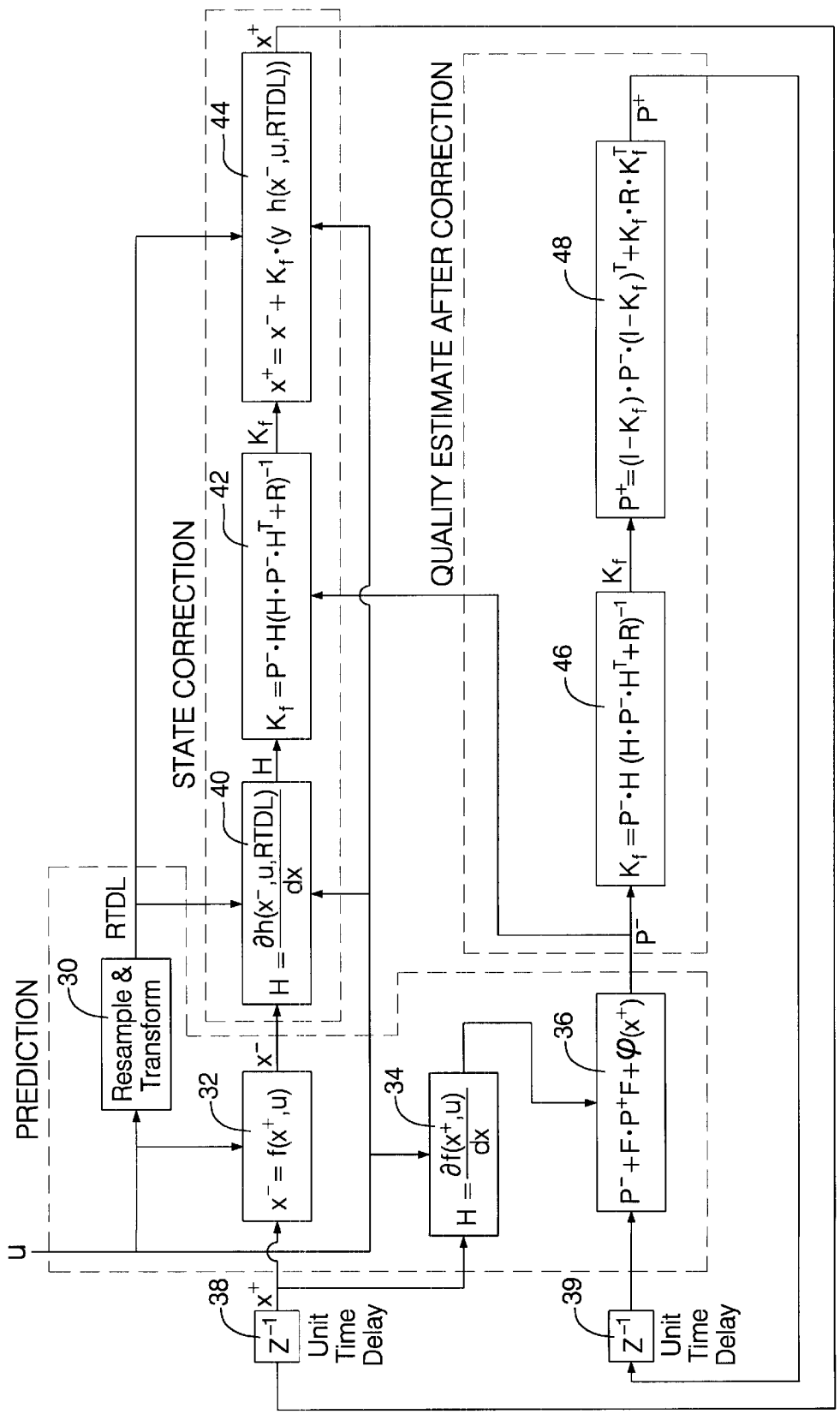
FIG. 4 is a process control flow diagram of the preferred method of the present invention.

Propagate the covariance estimate, Let $P^-=F \cdot P^- \cdot F^T + \phi(Q, Qh, I)$ Prediction Every iteration of the preferred method comprises one or more prediction steps. When a prediction step occurs, three things happen. The nonlinear model is linearized about the current state, then this linear model is used to propagate the covariance of the estimate. The nonlinear model of the method is used to predict the next state the system. The modified current history vector (RTDL) is updated based on the current estimate. A simple embodiment of the modified current history vector is a tap delay line. The input vector u may be based on a measurement of current, or carried forward from a previous measurement. With reference to the signal flow diagram of FIG. 4, the following prediction steps may be executed.

Update the RTDL vector using u. See block 30 of FIG. 4.

Propagate the estimate, let $x^-=f(x^+,u)$. See block 32 of FIG. 4.

Linearize the model about the estimate, F=dfdx($x^+$, u). See block 34 of FIG. 4.

Propagate the covariance, get Q and QH from the $x^-$ vector, then let $P^-=F \cdot P^+ \cdot F+\phi(Q,Q_H,I)$. See block 36 of FIG. 4. Block 36 generates a quality estimate of the state estimate before the correction step.

Blocks 38 and 39 represent unit time delays.

Correction and Quality Estimate

To correct the estimate, a measurement is made of current and voltage. Based on a linearized model of the battery, about its present state estimate, the measurement correction is performed as follows.

Sample voltage and current. Assign these values to u, y, respectively.

Note: Voltage and current are sampled synchronously.

Let u=[I].

Let y=[V]

Perform the measurement correction step of the Kalman Filter:

Linearize the model about the current state, let H=dhdx ($x^-$,u,RTDL). See block 40 of FIG. 3.

Let Re=H·$P^-$·H$^T$+R.

Calculate the Filter Gain, let $K_f=P^- \cdot H^T \cdot Re^{-1}$. See blocks 42 and 46 of FIG. 4.

Calculate the innovation (the difference between the estimate and the measured value), let e=y−h($x^-$,u, RTDL).

Update the state estimate, let $x^+=x^-+K_f \cdot e$. See block 44 of FIG. 4.

Let KG=($I_{Identity}$−Kf·H).

Update the covariance value, let $P^+=KG \cdot P^- \cdot KG^T + Kf \cdot R \cdot Kf^T$. See block 48 of FIG. 4.

Blocks 46 and 48 generate a quality estimate of the ?? after the correction steps.

Finally, the updated state variables are stored in nonvolatile memory. The SOC of the battery pack 16 is obtained by recovering the $1^{st}$ element of the $x^+$ vector, Q, and calculating state of charge as the ratio of the estimated charge to the maximum charge capacity of the pack:

$$SOC = \frac{Q}{Q_{\max}}.$$

The present invention further includes an acceptance and discharge capability predictor algorithm (i.e., power) that utilizes the SOC methods of the present invention. The SOC method constructs a model of the battery in the process of predicting SOC. This model can be used to predict the charge acceptance of the battery or the discharge capability of the battery.

For the purposes of this discussion, charge acceptance is a measure of the amount of power that can be accepted by the battery until a defined voltage lid is reached. Discharge capability is defined as a measure of the amount of power that can be sourced by the battery until a defined voltage floor is reached.

One measure of charge acceptance is the amount of time that a fixed power level can be accepted or delivered by the battery. The following method will calculate this:

Where P is the desired power level, $t_{max}$ is the maximum time of charge acceptance, $V_{Lid}$ is the highest voltage that can be sustained, and $V_{Floor}$ is the lowest voltage that can be sustained by executing the following:

Make a copy of the current state variables, let $\hat{x}=[Q\ Q_H\ \alpha^T]^T$.

Make a copy of the current tap delay line, let $R\hat{T}DL=RTDL$.

Measure the voltage and store in $\hat{V}$.

Measure the temperature and store in T.

Assume that the power level can be sustained, t=0.

Repeat until $(t>t_{max})$ or $(V>V_{Lid})$ or $(V<V_{Floor})$ $$\text{Let } \hat{I} = \frac{P}{\hat{V}}.$$

Let $\hat{u}=[\hat{I}\ T]^T$.

Update the tap delay line $R\hat{T}DL$ using $\hat{I}$.

Let $x=f(\hat{x},\hat{u})$.

Let $\hat{V}=h(\hat{x},\hat{u},R\hat{T}DL)$.

Let t=t+Ts.

On exiting this loop, the minimum time at power P is greater then t.

While this invention has been described in terms of some specific embodiments, it will be appreciated that other forms can readily be adapted by one skilled in the art. Obvious adaptations include, but are not limited to, the use of a finite differences model (or finite element model) of the battery chemistry, alternative electrical models of the battery, and using voltage where current is used in the preferred embodiment. Accordingly, the scope of this invention is to be considered limited only by the following claims.

What is claimed is:

1. A method of determining the state of a battery comprising the steps of:
   generating a state vector that describes the state of the battery;
   predicting a response for the state vector;
   measuring a response of the battery; and
   correcting the state vector based on the differences between the predicted response and the measured response to determine the state of the battery.

2. The method of claim 1 wherein the state of the battery comprises a state of charge.

3. The method of claim 1 wherein the state of the battery comprises the battery power.

4. The method of claim 1 wherein the state of the battery comprises the temperature of the battery.

5. The method of claim 1 wherein the step of generating the state vector that describes the state of the battery comprises generating a state vector that includes a state of charge estimate, a hysteresis charge estimate, the battery temperature, and a vector of learned battery responses.

6. The method of claim 1 further comprising the step of initializing the state vector.

7. The method of claim 1 further comprising the step of generating a history vector, wherein the history vectors transforms an input vector into an updated history vector.

8. The method of claim 7 wherein the the step of the history vectors transforming an input vector into an updated history vector comprises the steps of transforming linear and nonlinear functions by scaling, filtering, or time delaying the linear and nonlinear functions.

9. The method of claim 7 wherein the step of generating the history vector comprises generating a history vector that includes electrical current history.

10. The method of claim 7 wherein the step of generating the history vector comprises generating a history vector that includes battery temperature.

11. The method of claim 1 further comprising monitoring the voltage, temperature, and current of the battery.

12. The method of claim 1 further comprising the step of providing the battery in a portable electronic device.

13. The method of claim 1 further comprising the step of providing the battery in an electric vehicle.

14. The method of claim 1 further comprising the step of providing the battery in a hybrid vehicle.

15. A method for predicting the state of charge of a battery comprising the steps of:
   generating a state vector describing the state of the battery, including the state of charge of the battery;
   initializing the state vector;
   predicting a battery response;
   measuring a battery response; and
   determining the state of charge from the difference between the predicted and measured battery responses.

16. The method of claim 15 wherein the step of measuring a battery response comprises monitoring the voltage, temperature, and current of the battery.

17. The method of claim 15 wherein the step of generating the state vector that describes the state of the battery comprises generating a state vector that includes a state of charge estimate, a hysteresis charge estimate, and a vector of learned battery responses.

18. A method of predicting the state of a battery comprising the steps of:
   generating a state vector describing the state of the battery, the state vector including a plurality of learned battery responses;
   initializing the state vector;
   generating a covariance matrix;
   initializing the covariance matrix;
   generating a history vector;
   initializing the history vector;
   updating the history vector based on an electrical current estimate for the battery;
   propogating the estimate;
   linearizing the state vector about the estimate;
   propogating the covariance; and
   updating the state variables in the state vector.

19. The method of claim 18 further comprising the step of predicting a response for the state vector, the covariance matrix indicative of the quality of the predicted response of the state vector.

20. The method of claim 19 further comprising the steps of:
   computing a quality estimate of the predicted response based on the history vector and the covariance matrix; and
   updating the state vector based on the quality estimate.

21. The method of claim 18 further comprising the step of linearizing a nonlinear battery model by computing an estimate of quality for a predicted response of the battery.

* * * * *